US012803575B2

(12) United States Patent
Ghosh et al.

(10) Patent No.: US 12,803,575 B2
(45) Date of Patent: Nov. 17, 2026

(54) MULTIPLYING DIGITAL-TO-ANALOG CONVERTER

(71) Applicant: TEXAS INSTRUMENTS INCORPORATED, Dallas, TX (US)

(72) Inventors: Abhishek Ghosh, Bangalore (IN); Rajavelu Thinakaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/814,694

(22) Filed: Aug. 26, 2024

(65) Prior Publication Data

US 2026/0058670 A1 Feb. 26, 2026

(51) Int. Cl.

*H03M 1/78* (2006.01)
*H02M 3/06* (2006.01)
*H03M 1/80* (2006.01)

(52) U.S. Cl.

CPC ............. *H03M 1/785* (2013.01); *H02M 3/06* (2013.01); *H03M 1/808* (2013.01)

(58) Field of Classification Search

CPC ......... H03M 1/785; H03M 1/808; H02M 3/06
USPC ........................................................... 341/154
See application file for complete search history.

(56) References Cited

U.S. PATENT DOCUMENTS

| | | | | |
|---|---|---|---|---|
| 10,673,449 | B1 * | 6/2020 | Yang | H03M 1/0845 |
| 10,951,227 | B1 * | 3/2021 | Thinakaran | H03M 1/785 |
| 2009/0251344 | A1 * | 10/2009 | Wong | H03M 1/002 341/122 |
| 2021/0000357 | A1 * | 1/2021 | Li | A61B 5/681 |
| 2024/0039546 | A1 * | 2/2024 | Hsieh | H03M 1/002 |
| 2024/0178858 | A1 * | 5/2024 | Goyal | H03M 1/68 |

* cited by examiner

*Primary Examiner* — Jean B Jeanglaude
(74) *Attorney, Agent, or Firm* — Xianghui Huang; Charles F. Koch

(57) ABSTRACT

An apparatus includes a first RDAC having a first reference voltage input and a first output. The first RDAC includes a first resistor segment, coupled to the first reference voltage input, including a first resistor and a first selection circuit. The first selection circuit has an input coupled to the first resistor, a first selection circuit output coupled to the first output, and a second selection circuit output coupled to a ground terminal. A second RDAC has a second reference voltage input and a second output coupled to the first output. The second RDAC includes a second resistor segment, coupled to the second reference voltage input, which includes a second resistor and a second selection circuit. The second selection circuit has an input coupled to the second resistor, a third selection circuit output coupled to the first selection circuit output, a fourth selection circuit output coupled to the ground terminal.

19 Claims, 18 Drawing Sheets

MULTIPLYING DIGITAL-TO-ANALOG CONVERTER

BACKGROUND

A digital-to-analog converter (DAC) converts a digital signal into an analog signal. A DAC includes a digital input to which digital codes are provided. Using a reference voltage, a DAC converts the digital codes to an equivalent analog signal. A multiplying DAC (MDAC) can operate in a multiplying mode in which a fixed digital code and a time-varying reference voltage are provided to the MDAC or in a non-multiplying mode in which a fixed reference voltage and time-varying digital codes are provided to the MDAC. An application for the non-multiplying mode of operation is arbitrary waveform generation (AWG).

Unfortunately, in the non-multiplying mode of operation, switching an MDAC between digital codes can cause glitches in the output analog signal. The performance of existing MDACs generally plateaus for low-glitch applications or AWG). Some existing AWG applications may focus on either the audio band (e.g., less than 20 KHz) or mid-high frequency bands (e.g., greater than 100 KHz). However, DACs capable of operation up to 100 KHz may have degraded performance such as total harmonic distortion of 85 dBc at 100 KHz.

SUMMARY

In one example, an apparatus includes a first resistive digital-to-analog converter (RDAC) having a first reference voltage input and a first output. The first RDAC includes a first resistor segment coupled to the first reference voltage input. The first resistor segment includes a first resistor and a first selection circuit. The first selection circuit has an input coupled to the first resistor and has a first selection circuit output coupled to the first output and a second selection circuit output coupled to a ground terminal. A second RDAC has a second reference voltage input and a second output. The second output couples to the first output. The second RDAC includes a second resistor segment coupled to the second reference voltage input. The second resistor segment includes a second resistor and a second selection circuit. The second selection circuit has an input coupled to the second resistor and has a third selection circuit output coupled to the first selection circuit output and a fourth selection circuit output coupled to the ground terminal.

In another example, an apparatus includes an RDAC having a reference voltage terminal, a digital input terminal, and an output. A digitally-controlled impedance circuit has a control input and an output. The output of the digitally-controlled impedance circuit is coupled to the output of the RDAC.

In yet another example, an apparatus includes a first RDAC having a ground terminal and a first output. The first RDAC includes a first resistor segment coupled to the ground terminal. The first resistor segment includes a first resistor and a first selection circuit. The first selection circuit has an input coupled to the first resistor and has a first selection circuit output coupled to the first output and a second selection circuit output coupled to the ground terminal. A second RDAC has a first reference voltage terminal and a second output. The second output is coupled to the first output. The second RDAC includes a second resistor segment coupled to the first reference voltage terminal. The second resistor segment includes a second resistor and a second selection circuit. The second selection circuit has an input coupled to the second resistor and has a third selection circuit output coupled to the first selection circuit output and a fourth selection circuit output coupled to the ground terminal.

BRIEF DESCRIPTION OF THE DRAWINGS

FIGS. 3A-1 and 3A-2 (collectively, FIG. 3A) have a schematic diagram of a system including a complementary RDAC structure, in an example.

DETAILED DESCRIPTION

Figure 1:
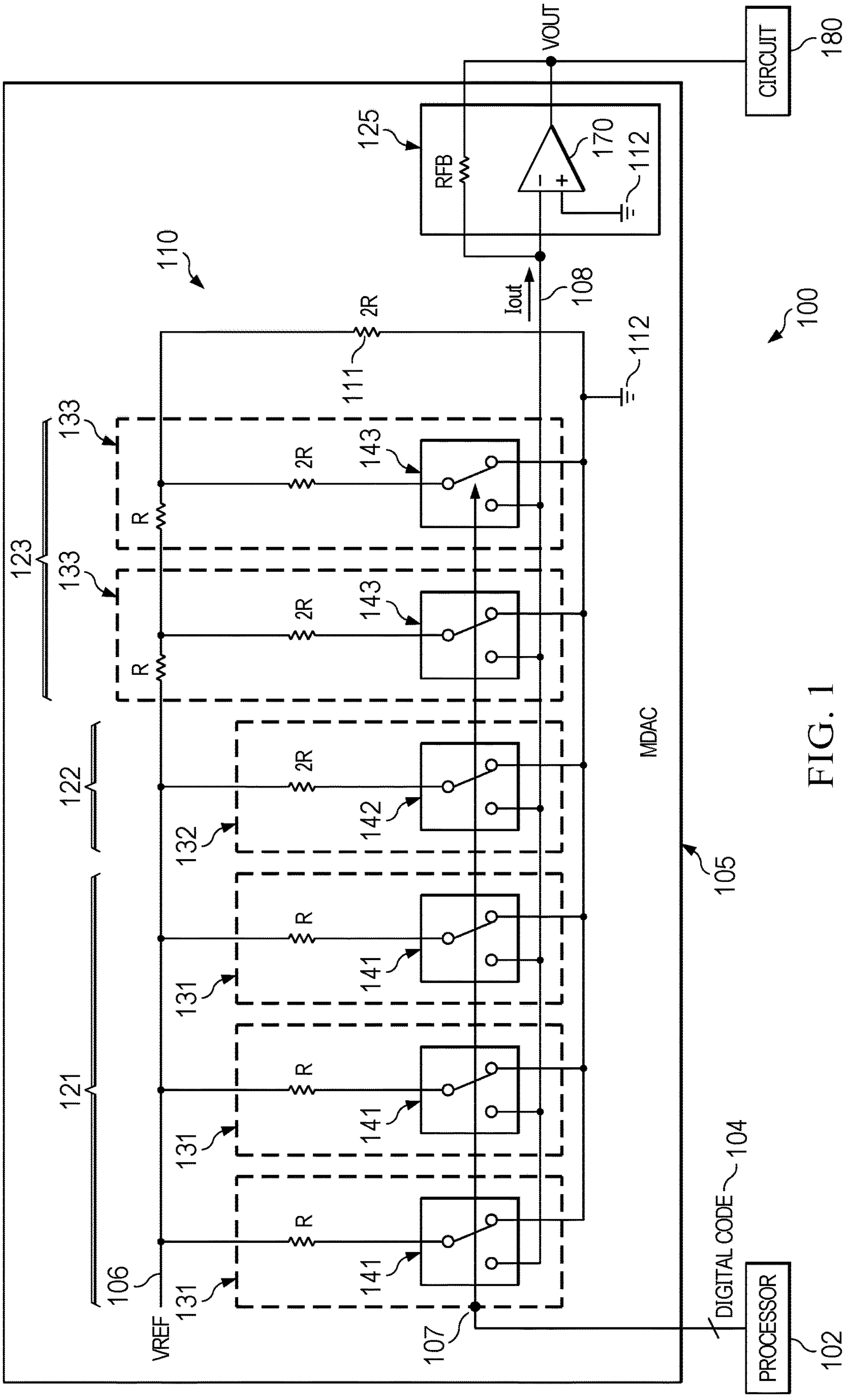
FIG. 1 is a schematic diagram of a system including a multiplying digital-to-analog converter (MDAC), in an example.

The same reference numbers or other reference designators are used in the drawings to designate the same or similar (either by function and/or structure) features.

FIG. 1 is a schematic diagram of a system 100 that includes a processor 102, an MDAC 105 and a circuit 180. MDAC 105 includes a resistive DAC (RDAC) 110 and a current-to-voltage (I2V) converter 125. Processor 102 may be a programmable controller (e.g., microcontroller), a digital circuit, etc. Processor 102 produces one or more digital codes 104. Based on the digital codes and a reference voltage VREF, the combination of RDAC 110 and I2V converter 125 produces a corresponding analog voltage VOUT. The analog voltage VOUT is then provided to, and used by, circuit 180.

RDAC 110 has a reference voltage input 106, a digital code input 107, and an output 108. A positive or negative reference voltage (e.g., VREF) may be provided to the reference voltage input 106. In the example of FIG. 1, RDAC 110 includes one or more thermometric slices 121, one or more binary slices 122, and one or more resistor-2 resistor (R-2R) slices 123. In other examples, RDAC 110 has only thermometric slices 121 and no binary slices 122 or R-2R slices 123. In yet another example, RDAC 110 has thermometric slices 121 and R-2R slices 123 and no binary slices 122. Slices 121-123 include corresponding resistor segments 131, 132, and 133. Each resistor segment 131 includes a resistor R coupled to a selection circuit 141. The resistors R have approximately the same resistance. In the example of FIG. 1, RDAC 110 has one binary slice 122, however, in other examples, RDAC 110 has more than one binary slice. The resistors of the resistor segments 132 of the binary slices 122 are binary-weighted (2R, 4R, 8R, etc.). Each resistor segment 132 includes a resistor 2R, 4R, etc. coupled to a selection circuit 142. Each resistor segment 133 of the R-2R slices 123 includes a resistor R coupled to a resistor with the twice the resistance of R (2R). The resistors 2R of resistor segments 133 are coupled to corresponding selection circuits 143. Each selection circuit 141, 142, and 143 has three terminals in the example of FIG. 1.

One terminal of the resistors R, 2R, etc. of the thermometric and binary slices 121 and 122 is coupled to the reference voltage input 106. The other terminal of resistors R, 2R of the thermometric and binary slices 121 and 122 is coupled to a terminal of the corresponding selection circuit 141 and 142. Of the other two terminals of selection circuits 141 and 142, one terminal is coupled to the output 108 of RDAC 110 and the other terminal is coupled to ground 112. Within the resistor segments 133 of the R-2R slices 123, the resistors R are coupled in series between the reference voltage input 106 and the last resistor 2R 111. One terminal of each resistor 2R of the resistor segments 133 is coupled to its corresponding resistor R, and the other terminal of the resistor 2R is coupled to a terminal of the corresponding selection circuit 144. As was the case for selection circuits 141 and 142, of the other two terminals of selection circuits 143, one terminal is coupled to the output 108 of RDAC 110 and the other terminal is coupled to ground 112.

With switch circuits 141-143 in the state shown in FIG. 1, the resistors of segments 121-123 are electrically coupled to ground 112. In the other switch circuit state, the resistor(s) of a given segment 121-123 is electrically coupled to output 108. Each digital code 104 includes multiple bits with each bit coupled to a corresponding selection circuit 141-143. In one example, a particular bit being a logic "1" causes the corresponding selection circuit 141-143 to electrically couple the resistor segment 131-133 to the output 108, and the bit being a logic "0" causes the selection circuit 141-143 to electrically couple the resistor segment 131-133 to ground 112.

I2V converter 125 includes an operational amplifier (OP AMP) 170 and a resistor RFB. Resistor RFB is coupled between the negative (−) input of OP AMP 170 and the OP AMP's output. The positive input of OP AMP 170 is coupled to ground 112. The output of OP AMP 170 provides the analog voltage VOUT. As a result of the relatively high gain of OP AMP 170 and the negative feedback through resistor RFB, the output 108 is a virtual ground.

In one example, RDAC 110 and resistor RFB are fabricated on a semiconductor die of an integrated circuit (IC), and OP AMP 170 is separate from that IC, as well as processor 102 and circuit 180. In another example, OP AMP 170 is on the same IC as RDAC 110 and resistor RFB. Either or both of processor 102 and circuit 180 may be on the same IC as RDAC 110.

Current IOUT is the output current from RDAC 110 and is a function of the applied digital code 104, the reference voltage VREF and the current through the least significant bit branch of RDAC 110. The output impedance of RDAC 110 is the effective resistance between the reference voltage terminal 106 and the output 108 and is set by the digital code 104. I2V converter 125 converts current IOUT to voltage VOUT. In one example and as described above, MDAC 105 can be operated in a multiplying mode or a non-multiplying mode. In the multiplying mode, a fixed digital code is provided to the selection circuits 141-143 and the reference voltage VREF is time-varying. In the multiplying mode, the MDAC scales the reference voltage by a value based on the fixed digital code. In the non-multiplying mode, the reference voltage VREF is a fixed voltage and the digital codes are time-varying. An application of the latter, non-multiplying mode is arbitrary waveform generation (AWG).

Figure 2:
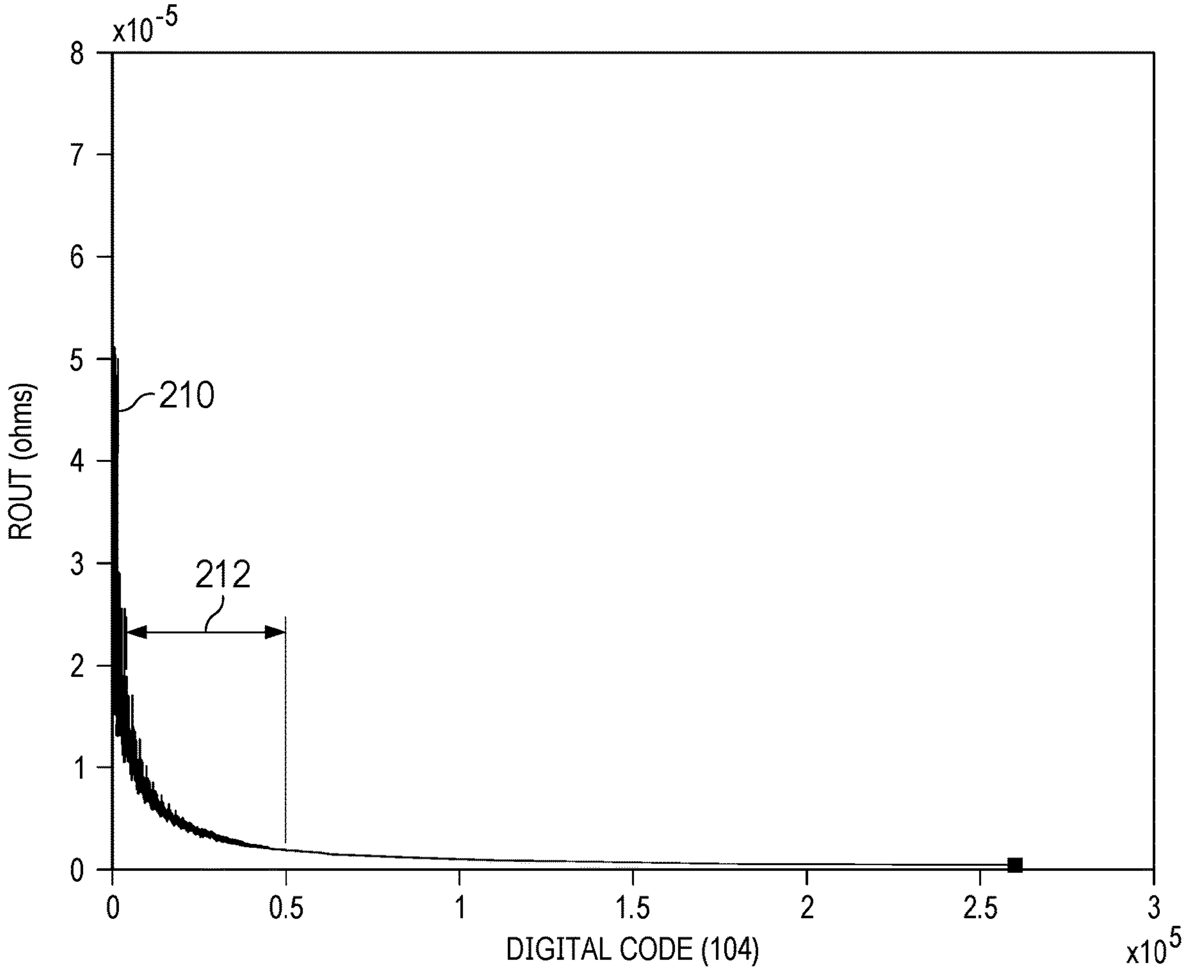
FIG. 2 is a graph of the output impedance of a segmented resistive digital-to-analog converter (RDAC) versus digital code, in an example.

As explained above, in the non-multiplying mode, time-varying digital codes 104 are provided to RDAC. FIG. 2 is a graph 210 of the output impedance (ROUT) of RDAC 110 as a function of digital code 104. The output impedance ROUT is dependent on the digital code 104. For example, the output impedance ROUT decreases (and generally non-linearly) with increasing digital code. The impedance variation from the thermometric and binary slices 121 and 122 is linear with respect to the digital code 1-4 while the impedance variation from the R-2R slices 123 is non-linear. Considering only the thermometric slices 121 of RDAC 110, for example, the output current IOUT is:

$$IOUT = \frac{VREF * k}{R} \tag{Eq. 1}$$

where k is the digital code 104 applied to the thermometric slices 121 and R is the resistance of each thermometric slice. Further, the output impedance of just the thermometric slices 121 is R/k. Accordingly, both the output current IOUT and the output impedance are code-dependent.

A problem with MDAC 105 in FIG. 1 is the presence of output glitches in the output voltage VOUT during a transition from one digital code to another digital code. Output glitches may be caused by unequal energies from one slice turning on (off) and other slices simultaneously turning off (on). Output glitches have digital-code dependent energy and code-dependent settling times, which result in transient non-linearity of RDAC 110.

Figures 1, 3A:
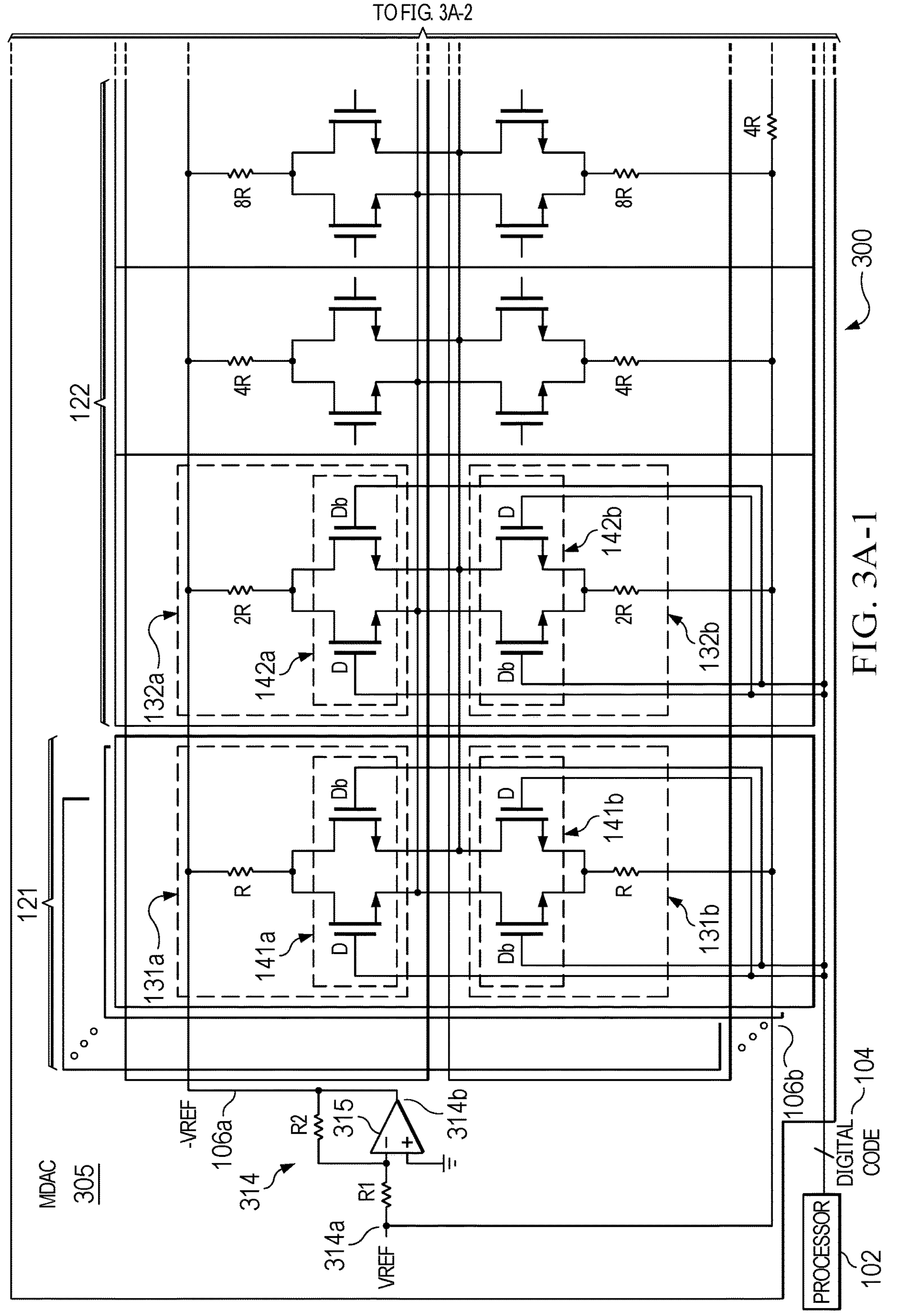

FIG. 3A is a schematic diagram of a system 300 which includes an MDAC 305 coupled to processor 102 and to circuit 180. In this example, MDAC 305 includes complementary RDACs 110*a* and 110*b*. RDAC 110*a* includes a reference voltage input 106*a*. RDAC 110*b* also includes a reference voltage input 106*b*. RDACS 108*a* and 108*b* share the same output 108.

RDAC 110*a* is configured much the same as RDAC 110 in FIG. 1. The thermometric slices 121 of RDAC 110*a* include resistor segments 131*a*, with each resistor segment 131*a* including a resistor R and a selection circuit 141*a*. The binary slices 122 of RDAC 110*a* include resistor segments 132*a*, with each resistor segment 132*a* including a resistor 2R, 4R, 8R, etc. and a selection circuit 142*a*. The R-2R slices 123 of RDAC 110*a* include resistor segments 133*a* and corresponding selection circuits 143*a*. Similarly, for RDAC 110*b* thermometric slices 121 include resistor segments 131*b*, with each resistor segment 131*b* including a resistor R and a selection circuit 141*b*. The binary slices 122 of RDAC 110*b* include resistor segments 132*b*, with each resistor segment 132*b* including a resistor 2R, 4R, 8R, etc.

and a selection circuit 142*b*. The R-2R slices 123 of RDAC 110*b* include resistor segments 133*b* and corresponding selection circuits 143*b*.

RDAC 110*b* is configured much the same as RDAC 110*a* but has several differences. Whereas the reference voltage input 106*a* of RDAC 110*a* receives a negative reference voltage −VREF, the reference voltage input 106*b* of RDAC 110*b* receives a positive reference voltage VREF. In one example, the absolute value of the reference voltages −VREF and VREF is the same. MDAC 305 includes an inverting buffer 314. Inverting buffer 314 includes resistors R1 and R2 and an OP AMP 315. Resistors R1 and R2 may have the same resistance to provide a unity gain (negative) for inverting buffer 314. Resistor R1 is coupled between input 314*a* and the negative input of OP AMP 315. Resistor R2 is coupled between the negative input of OP AMP 315 and the output of OP AMP 315. The input 314*a* of inverting buffer 314 is coupled to the reference voltage input 106*b*, and the output 314*b* of inverting buffer 314 is coupled to the reference voltage input 106*a*. In the example of FIG. 3A, positive reference voltage VREF is provided to input 314*a*, and the inverting buffer 314 generates the negative reference voltage −VREF which is provided to the reference voltage input 106*a*.

Figures 2, 3A:
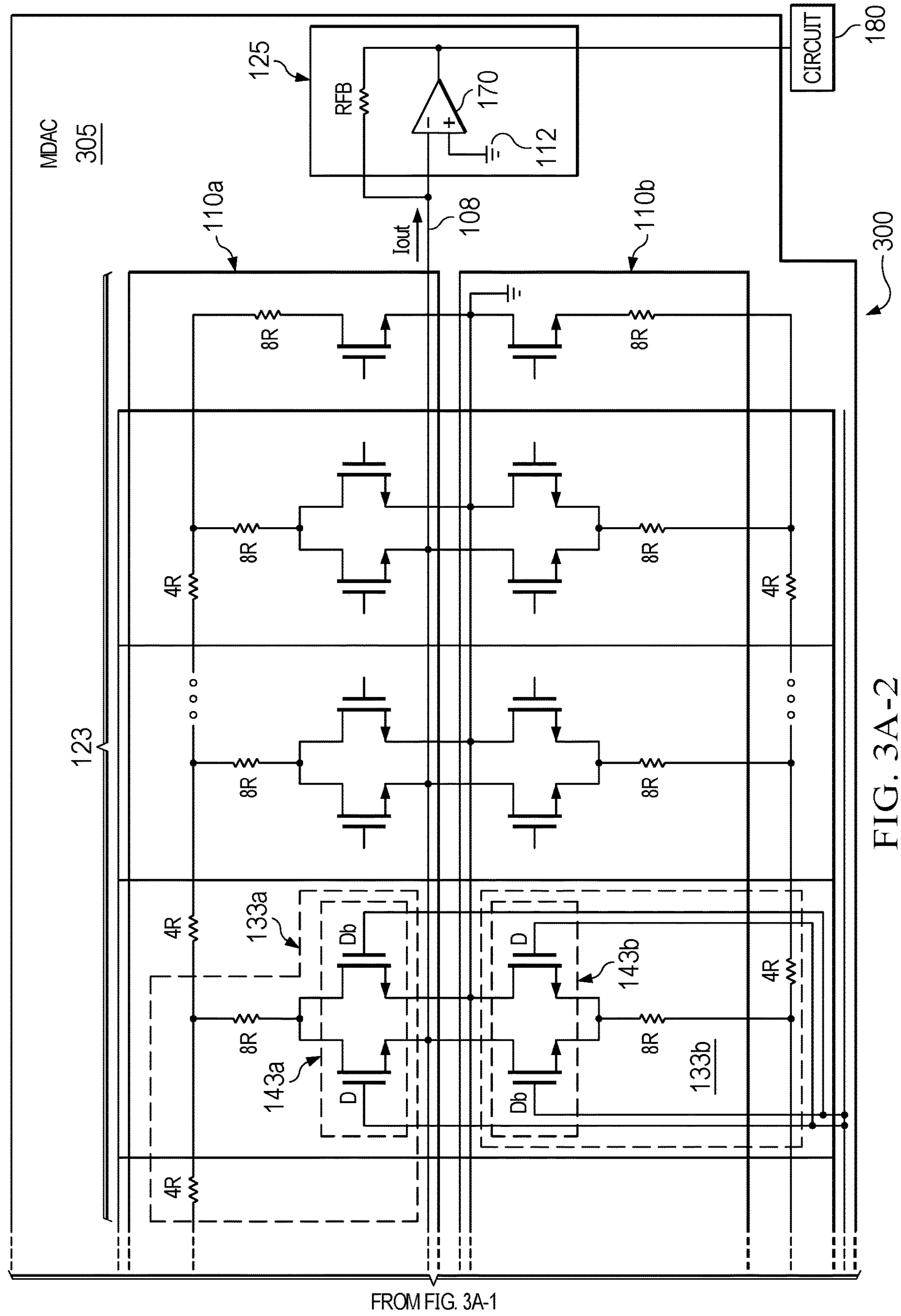
Figure 3B:
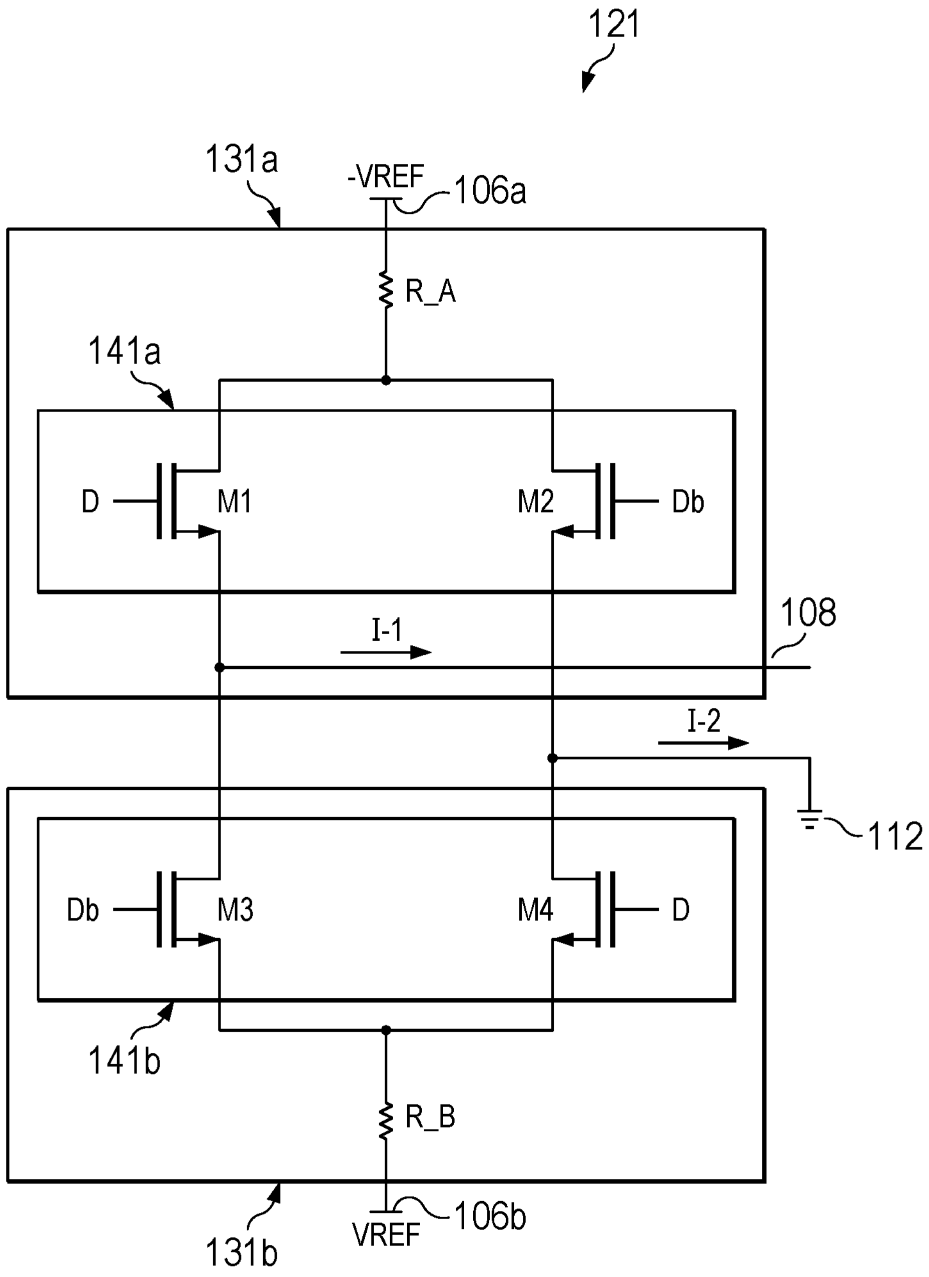
FIG. 3B is a schematic diagram of a portion of the complementary RDAC structure of FIG. 3B, in an example.

A second difference between RDAC 110*a* and 110*b* is illustrated in FIG. 3B, which is a schematic diagram of an example of one of the slices 121 of MDAC 305, although the following discussion applies equally to the binary and R-2R slices 122 and 123. Selection circuit 141*a* includes transistors M1 and M2. Selection circuit 141*b* includes transistors M3 and M4. In this example, transistors M1-M4 are n-channel field effect transistors (NFETs) but can be other types of transistors in other examples. The drains of transistors M1 and M2 are coupled together and to one terminal of the upper resistor R_A. The other terminal of resistor R_A is coupled to reference voltage terminal 106*a* and receives reference voltage −VREF. The sources of transistors M3 and M4 are coupled together and to one terminal of the lower resistor R_B. The other terminal of resistor R_B is coupled to reference voltage terminal 106*a* and receives reference voltage VREF. The source of transistor M1 is coupled to the drain of transistor M3 and to output 108. Similarly, the source of transistor M2 is coupled to the drain of transistor M4 and to ground 112. In another example, the sources and drains of transistors M1-M4 can be interchanged.

As described above, each slice 121-123 receives a bit D of digital code 104. The bit D is controls the on and off states of transistors M1-M3. Bit D drives the gates of transistors M1 and M4 and the logical inverse of bit D drives the gates of transistors M2 and M3. Accordingly, when bit D is in a first logic state (e.g., a logic 1), transistors M1 and M4 are on and transistors M2 and M3 are off. Conversely, when bit D is in a second logic state (e.g., a logic 0), transistors M2 and M3 are on and transistors M1 and M4 are off. Accordingly, when bit D is a logic 1, transistors M1 and M4 are on and current I_1 flows through resistor R_A and transistor M1 to output 108 and current I_2 flows through resistor R_B and transistor M4 to ground 112. With resistor R_A receiving a negative reference voltage −VREF, current I_1 is negative when bit D is a logic 1. When bit D is a logic 0, transistors M2 and M3 are on and current I_1 flows through resistor R_B and transistor M3 to output 108 and current I_2 flows through resistor R_A and transistor M2 to ground 112. With resistor R_B receiving a positive reference voltage VREF, current I_1 is positive when bit D is a logic 0.

As is illustrated in FIG. 3B and described above, one or the other of resistors R_A and R_B is electrically coupled to the output 108 based on the logic state of bit D. By contrast, for MDAC 105 in FIG. 1, a given resistor segment 131-133 of slices 121-123 is only electrically coupled to output 108 for one logic state of the corresponding bit of the digital code 104. For MDAC 305 of FIG. 3, because a resistor of resistor segment 131*a* or 131*b* is electrically coupled to output 108 for either logic state of bit D, the output impedance ROUT of the thermometric slices 121 and the binary slices 122 of MDAC 305 are not, or much less, a function of digital code 104 than for MDAC 105 in FIG. 1. Considering only N thermometric slices 121, the output current IOUT for MDAC 305 is:

$$IOUT = \frac{VREF*k}{R} - \frac{[VREF*(N-k)]}{R} = \frac{[(2k-N)*VREF]}{R} \quad \text{(Eq. 2)}$$

where k is the applied digital code. Accordingly, output current IOUT is based on digital code. The output impedance of is R/k in parallel with R/(N−k) which is equal to:

$$\frac{\frac{R}{k}*\frac{R}{N-k}}{\frac{R}{k}+\frac{R}{N-k}} = R/N \quad \text{(Eq. 3)}$$

Figure 5A:
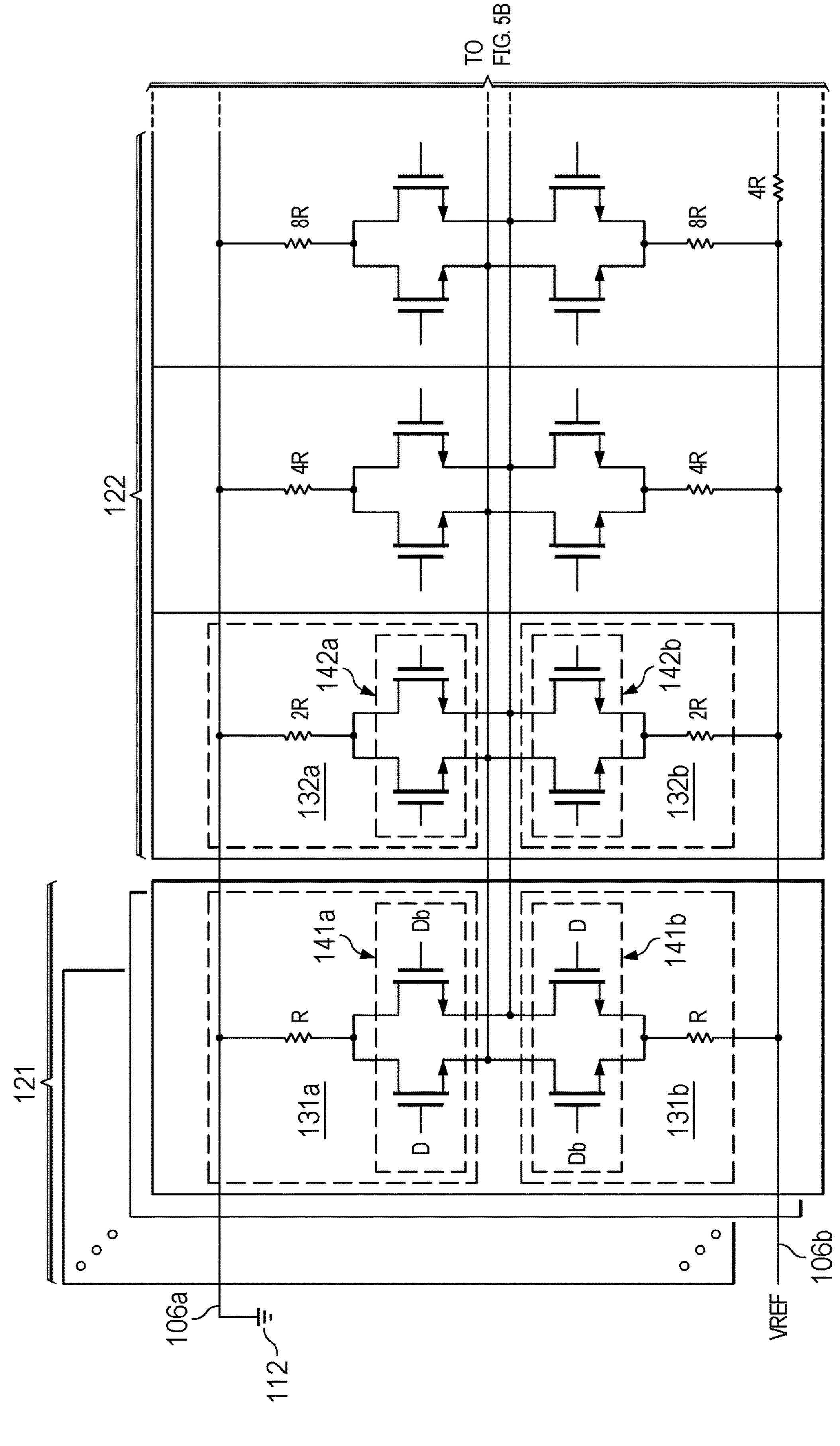
FIGS. 5A and 5B (collectively, FIG. 5) have a schematic diagram of an MDAC having complementary RDACs in which one of the reference voltage terminals is grounded, in an example.
Figure 5B:
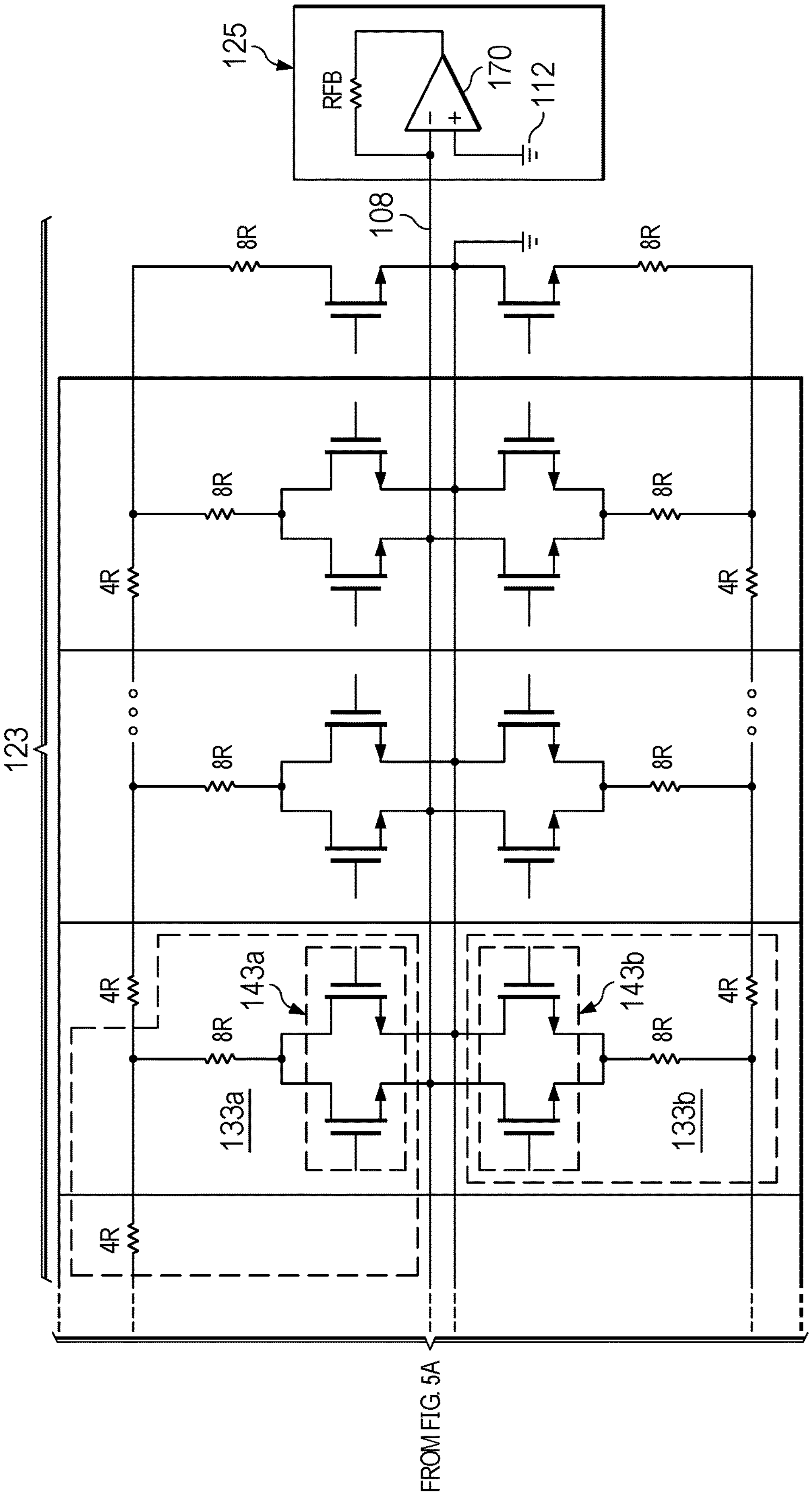

Accordingly, unlike for MDAC 105 in FIG. 5 for which the output impedance (R/k) of RDAC 110 is a function of digital code, the output impedance (R/N) of the complementary RDACs 110*a* and 110*b* for the thermometric and binary slices is generally not based on digital code. However, some digital code dependence remains for the R-2R slices 123. The benefit of a lower output glitch results from the energy for one-half of the RDAC turning on being provided by the other half turning off (charge injection cancelation) thereby reducing the glitch current flowing to the output 108. The feedback factor of I2V converter 125 is ROUT/(ROUT+RFB). Because output impedance of RDAC 110 is relatively constant across digital code 104, the feedback factor of I2V converter 125 advantageously is relatively constant as well. Further still, any deviation of the voltage of the virtual ground at output 108 has little, if any, effect on the output current IOUT.

Figure 4A:
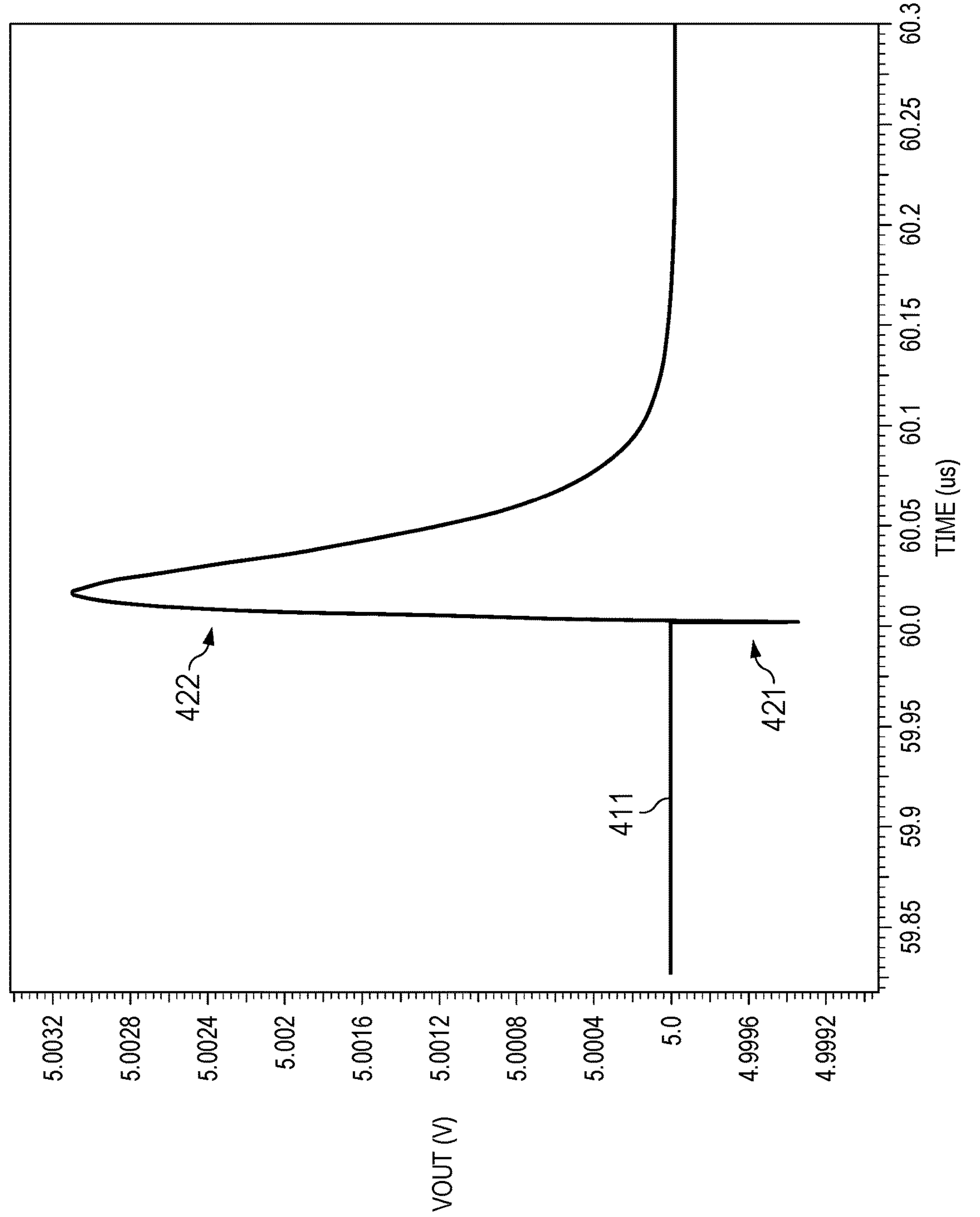
FIG. 4A is a waveform illustrating an output glitch for the MDAC of FIG. 1, in an example.

FIG. 4A is a graph of an example waveform 411 of the output voltage VOUT from MDAC 105 upon a change in digital code 104. The change in digital code causes an output glitch as shown. Output voltage VOUT drops (421) from its previous level of 5V to approximately 4.9994V and then rises (422) quickly to approximately 5.00308V over the course of approximately 29 nanoseconds (μs). The glitch energy (also called glitch impulse area) is the area under the glitch curve and has units of, for example, nv-s.

Figure 4B:
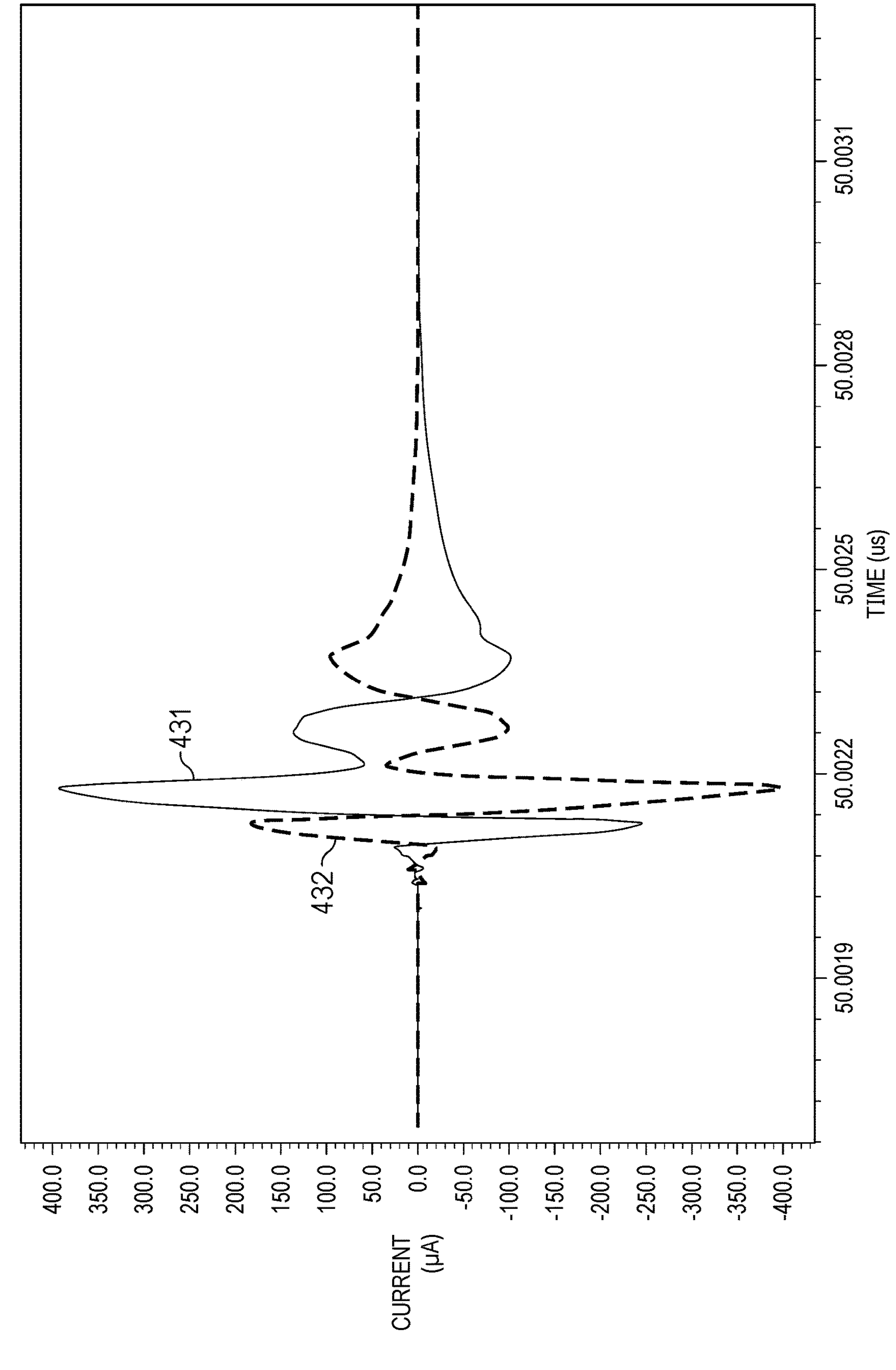
FIG. 4B are current waveforms of currents in the complementary RDACs of FIG. 3A.

FIG. 4B is a graph of waveforms 431 and 432 which represent currents from RDAC 110*a* and RDAC 110*b*, respectively, that combine to create output current IOUT. As current from one RDAC 110*a*, 110*b* increases, the current from the other RDAC 110*a*, 110*b* decreases, and vice versa.

Figure 4C:
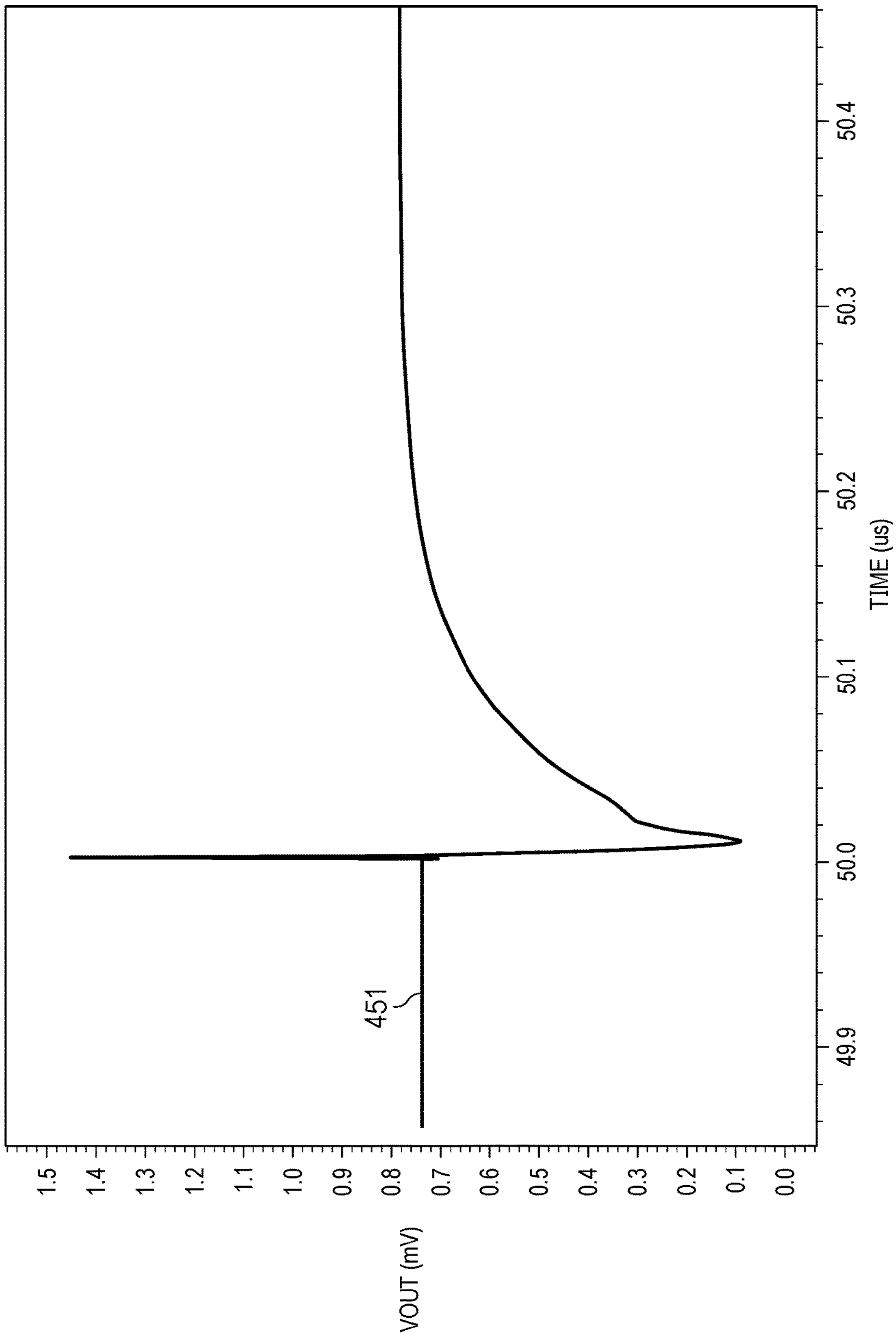
FIG. 4C is a waveform illustrating an output glitch for the MDAC of FIG. 3, in an example.

FIG. 4C is a graph of an example waveform 451 of the output voltage VOUT from MDAC 305 upon a change in digital code 104. The change in digital code also causes an output glitch, but the glitch energy of waveform 451 for MDAC 305 is smaller than the glitch energy of FIG. 4A for MDAC 105.

In some examples, the midcode value of the digital code 104 corresponds to a bipolar zero value. In a multiplying mode, at digital codes at or near the midcode value, the output being zero is dependent on current cancellation between two RDACs 110*a* and 110*b*. At relatively low frequencies, the currents cancel each other. However, due to parasitic capacitance within the RDACs 110*a* and 110*b* and the phase lag introduced by the inverting buffer 314, at higher frequencies, the currents through the R-2R slices 123 may not sufficiently cancel each other.

FIG. 5 is a schematic diagram of MDAC 305 which addresses the problem noted above. In FIG. 5, reference voltage terminal 106*a* is coupled to ground 112 and reference voltage terminal 106*b* receives the positive reference voltage VREF. In another example, reference voltage terminal 106*b* can be coupled to ground 112 and reference voltage terminal 106*a* receives the negative reference voltage VREF. By coupling one of the reference voltage terminals 106*a*, 106*b* to ground, MDAC 305 of FIG. 5 operates in a unipolar mode. Signal conduction to output 108 is through only RDAC 110*b* (or RDAC 110*a* if reference voltage terminal 106*b* is grounded). The output impedance of the complementary RDACs 110*a* and 110*b* remains relatively constant as described above.

As noted above, the complementary RDACs 110*a* and 110*b* help to reduce the output impedance dependence on digital code 104 for the thermometric and binary slices 121 and 123 but an output impedance dependance on digital code within the R-2R slices 123 may remain. The R-2R-based digital dependence may be non-linear. This R-2R-based digital code dependence contributes to some of the overall non-linearity of the MDAC.

Figure 6A:
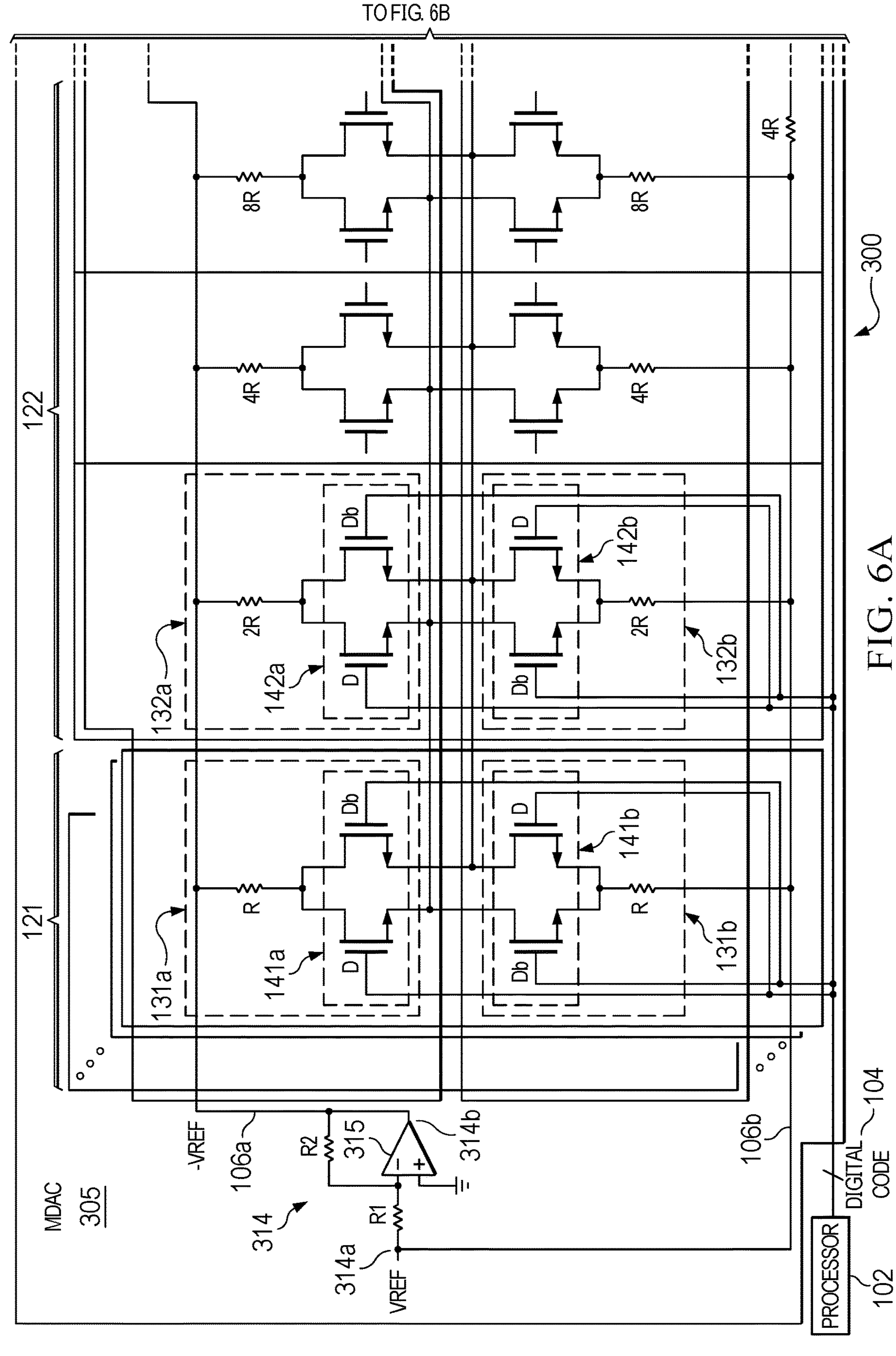
FIGS. 6A and 6B (collectively, FIG. 6) have a schematic diagram of the MDAC of FIG. 3 having complementary RDACs and includes a digitally-controlled impedance circuit, in an example.
Figure 6B:
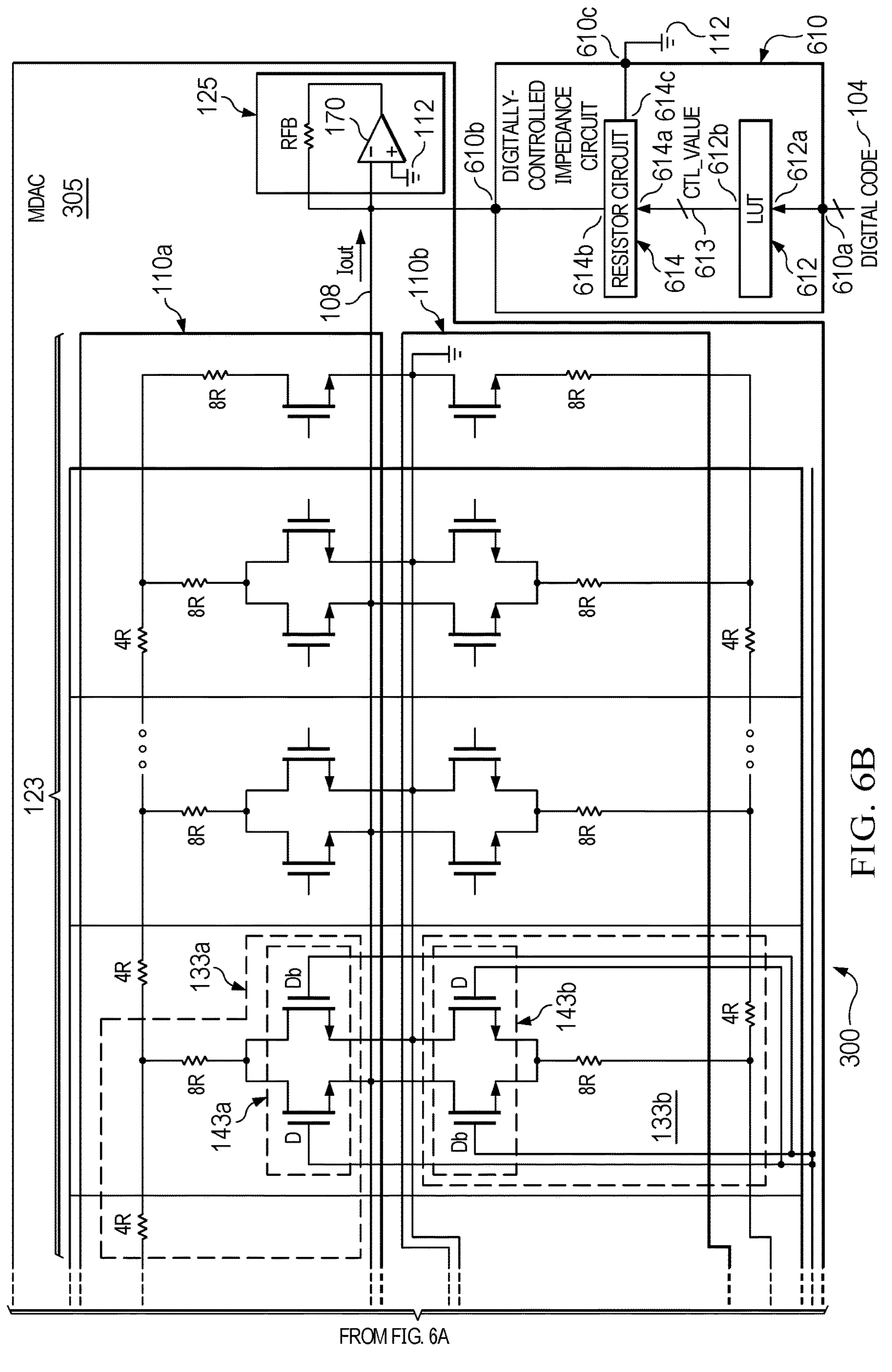

FIG. 6 is a schematic diagram of an MDAC 305 that includes a digitally-controlled impedance circuit (DCZC) 610 to address the non-linearity problem of the R-2R slices 123 described above. In one example, the inclusion of the digitally-controlled impedance circuit 610 obviates the need for precise offset trimming. Digitally-controlled impedance circuit 610 has a control input 610*a* and terminals 610*b* and 610*c*. Control input 610*a* receives some or all of the bits of the digital code 104. Terminal 610*b* is coupled to output 108. Terminal 610*c* is coupled to ground 112

In the example of FIG. 6, digitally-controlled impedance circuit 610 includes a look-up table (LUT) 612 and a resistor circuit 614. Control input 610*a* is coupled to an input 612*a* of LUT 612. The output 612*b* of LUT 612 is coupled to an input 614*a* of resistor circuit 614. A terminal 614*b* of resistor circuit 614 is coupled to terminal 610*b*. Another terminal 614*c* of resistor circuit 614 is coupled to terminal 610*c*. LUT 612 is preset (e.g., programmed) with multiple control values (CTL_VALUE) 613 based on digital code values. The control values 613 are provided to resistor circuit 614. Based on a given control value 613, resistor circuit 614 implements a resistance between terminal 610*b* and 610*c*. The resistance implemented by resistor circuit 614 is coupled between output 108 and ground and, accordingly, is in parallel with the output impedance of RDACs 110*a*, 110*b*. To a large degree, the resistances implemented by resistor circuit 614 offset residual impedance variation not otherwise reduced by the complementary RDAC structure described above.

In one example, circuit simulations can be performed on the complementary RDACs 110*a*, 110*b* for different digital code transitions to obtain estimates of the output impedance of the complementary RDACs 110*a*, 110*b*. Based on such output impedances, corresponding resistances to be coupled between output 108 and ground 112 can be determined. Control values can then be determined to obtain such resistances for resistor circuit 614. Because the resistances implemented by the digitally-controlled impedance circuit 610 are between output 108, which is a virtual ground, and ground 112, there is little if any current flow through the resistances implemented by the digitally-controlled impedance circuit 610.

Figure 7:
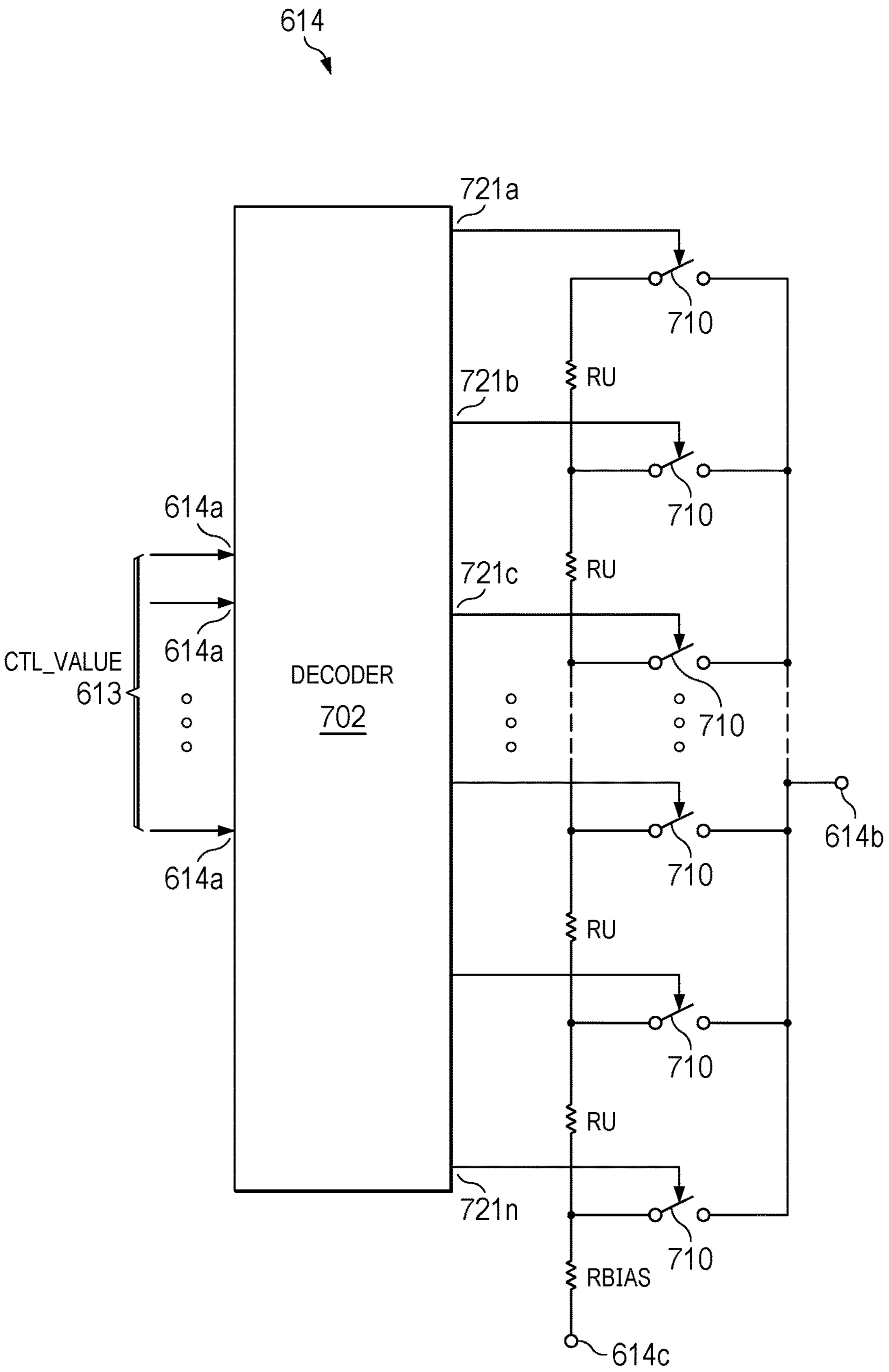
FIG. 7 is a schematic diagram of a resistor circuit included within the digitally-controlled impedance circuit of FIG. 6, in an example.

FIG. 7 is a schematic diagram of resistor circuit 614 in one example. Resistor circuit 614 includes a decoder 702, unit resistors RU, a bias resistor RBIAS, and switches 710. The resistance of the unit resistors RU are approximately the same. The resistance of bias resistor RBIAS may be the same as the unit resistors RU or different. Decoder 702 has inputs corresponding to control input 614*a* and receives the control value CTL_VALUE 613 from LUT 612. Decoder 702 has outputs 721*a*, 721*b*, 721*c*, . . . , 721*n*. Each output 721*a*-721*n* is coupled to a control input of a corresponding switch 710. Switches 710 may include transistors (e.g., FETs), and the control inputs are, for example, the gates of the transistors. Unit resistors RU and bias resistor RBIAS are coupled in series. One terminal of each switch 710 is coupled to a terminal of a unit resistor RU. The opposing terminals of switches 710 are coupled together and to terminal 614*b*.

Based on the control value CTL_VALUE 613, decoder 702 generates a signal at each output 721*a*-721*n*. Each such output signal causes the corresponding switch 710 to open (e.g., if the control signal is a logic 1) or close (e.g., if the control signal is a logic 0). Based on the switches 710 that are open or closed, a different resistance is created between terminals 614*b* and 614*c*.

Each switch 710 has a parasitic capacitance, e.g., gate-to-source capacitance, drain-to-source capacitance, etc. The parasitic capacitances of switches 710 are in parallel and add together. Accordingly, the larger is the number of switches 710, the larger is the total parasitic capacitance of resistor circuit 614. A trade-off can be made between the resolution of resistor circuit 614 and the parasitic capacitance. For example, a resolution of 4 or 5 bits of digital code 104 (16-32 switches 710) may be satisfactory for 18-bit MDAC applications.

Figure 8A:
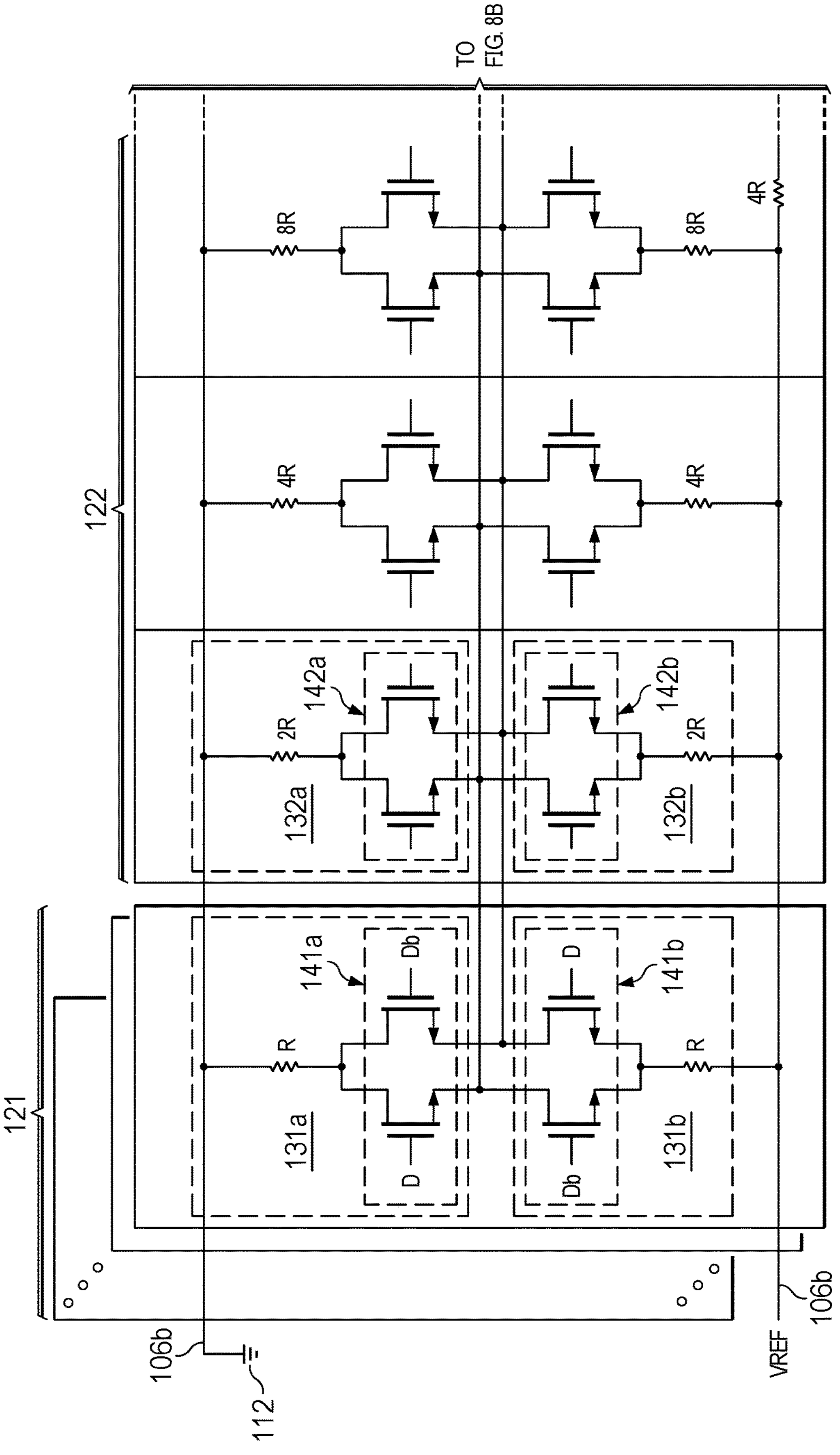
FIGS. 8A and 8B (collectively, FIG. 8) have a schematic diagram of the MDAC of FIG. 5 and includes a digitally-controlled impedance circuit, in an example.
Figure 8B:
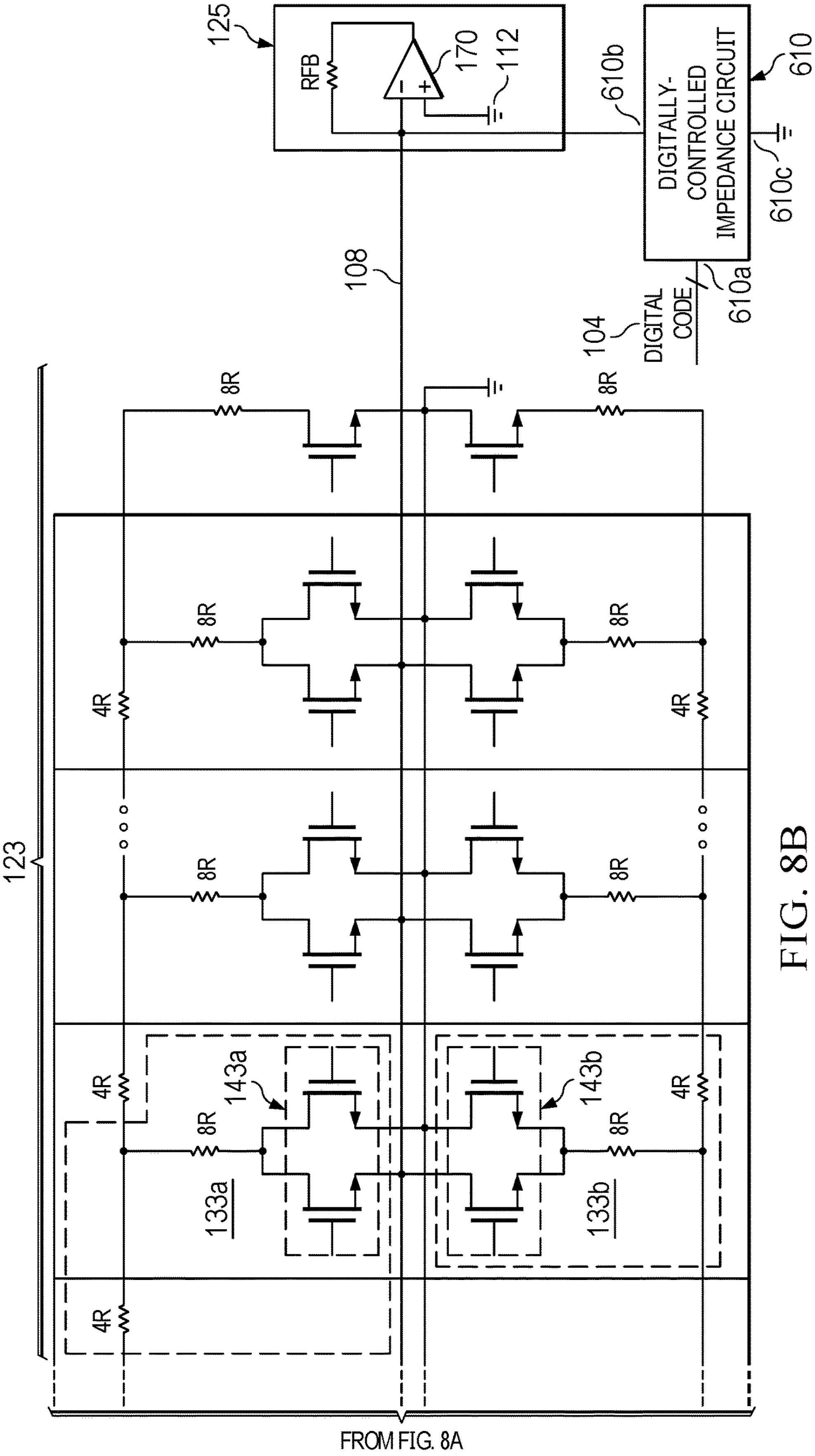

FIG. 8 is a schematic diagram of MDAC 305 of FIG. 5 for which one of the reference voltage terminals (e.g., reference voltage terminal 106*a*) is coupled to ground. FIG. 8 also includes the digitally-controlled impedance circuit 610 coupled between output 108 and ground 112. Accordingly, the digitally-controlled impedance circuit 610 can also be used for the example MDAC 305 of FIG. 5.

Figure 9:
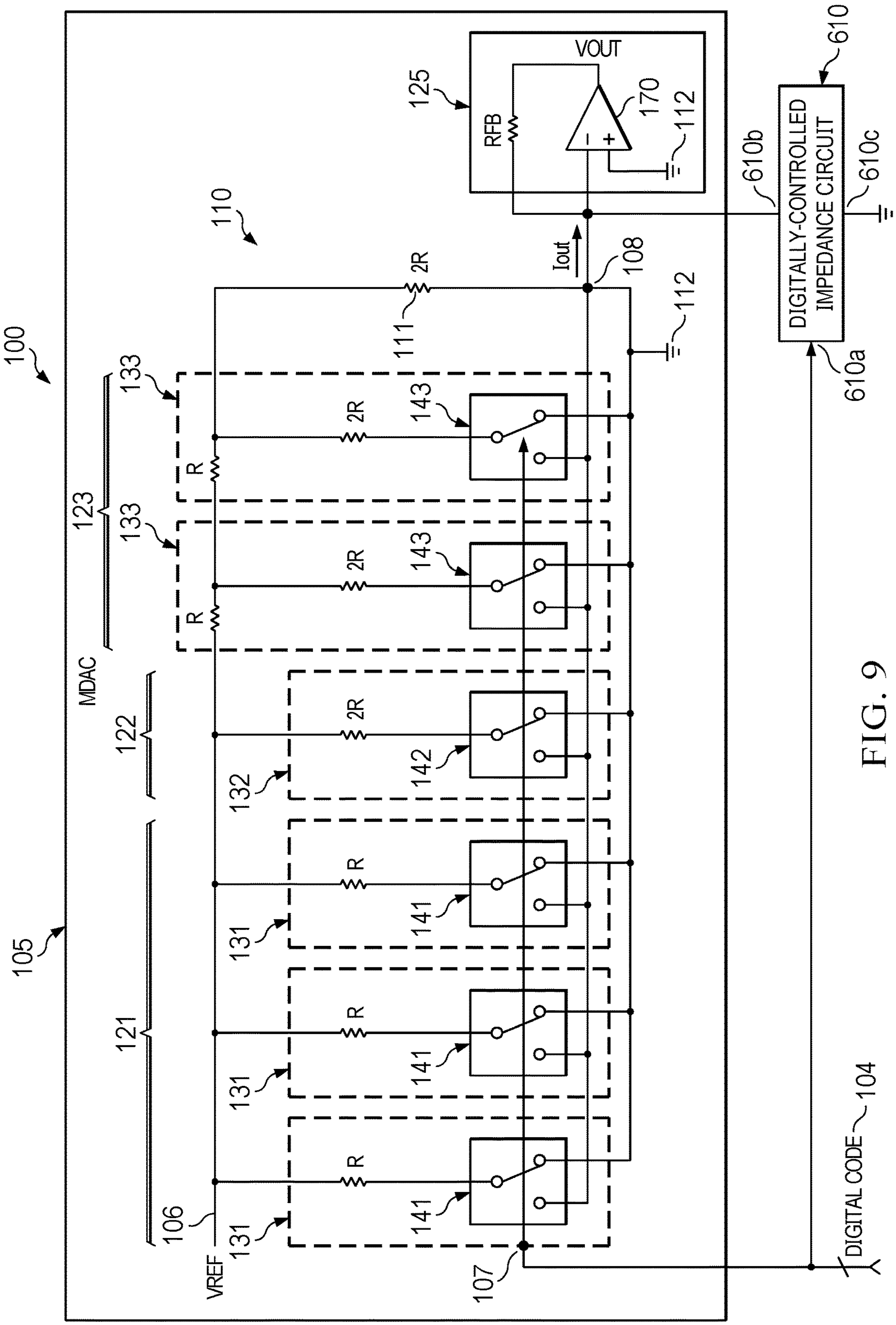
FIG. 9 is a schematic diagram of the MDAC of FIG. 1 and includes a digitally-controlled impedance circuit, in an example.

FIG. 9 is a schematic diagram of the MDAC 105 of FIG. 1 which includes RDAC 110 that is not a complementary RDAC structure as in FIG. 3, 5, 6, or 8. FIG. 9 also includes the digitally-controlled impedance circuit 610 coupled between output 108 and ground 112. Accordingly, the digitally-controlled impedance circuit 610 can also be used for the example MDAC 105 of FIG. 1. In such a configuration, the number of bits of resolution of the digital code 104 provided to digitally-controlled impedance circuit 610 may be larger than for the examples of FIGS. 6 and 8, which include a complementary MDAC 305.

Any direct current (DC) offset of a ground buffer (described below) may also impact the performance of the MDAC due to the digital code non-linearity dependence of the R-2R slices. The problem of ground buffer DC offset is pronounced for applications in which the positive input of the I2V converter's OP AMP 170 is not coupled to the ground buffer output, which may be the case for high frequency applications to avoid signal content on the ground buffer output from being present on the output of the I2V converter 125. Some MDACs may reduce the DC offsets of the ground buffers through offset-trimming over multiple temperature conditions, which is a time-consuming process. Some MDACS may mitigate the non-linearities with the R-2R slices 123 by increasing the number of thermometric and binary slices 121 and 122 and reducing the number of R-2R slices 123. This latter approach, however, comes at the cost of increased area of the MDAC.

Figure 10A:
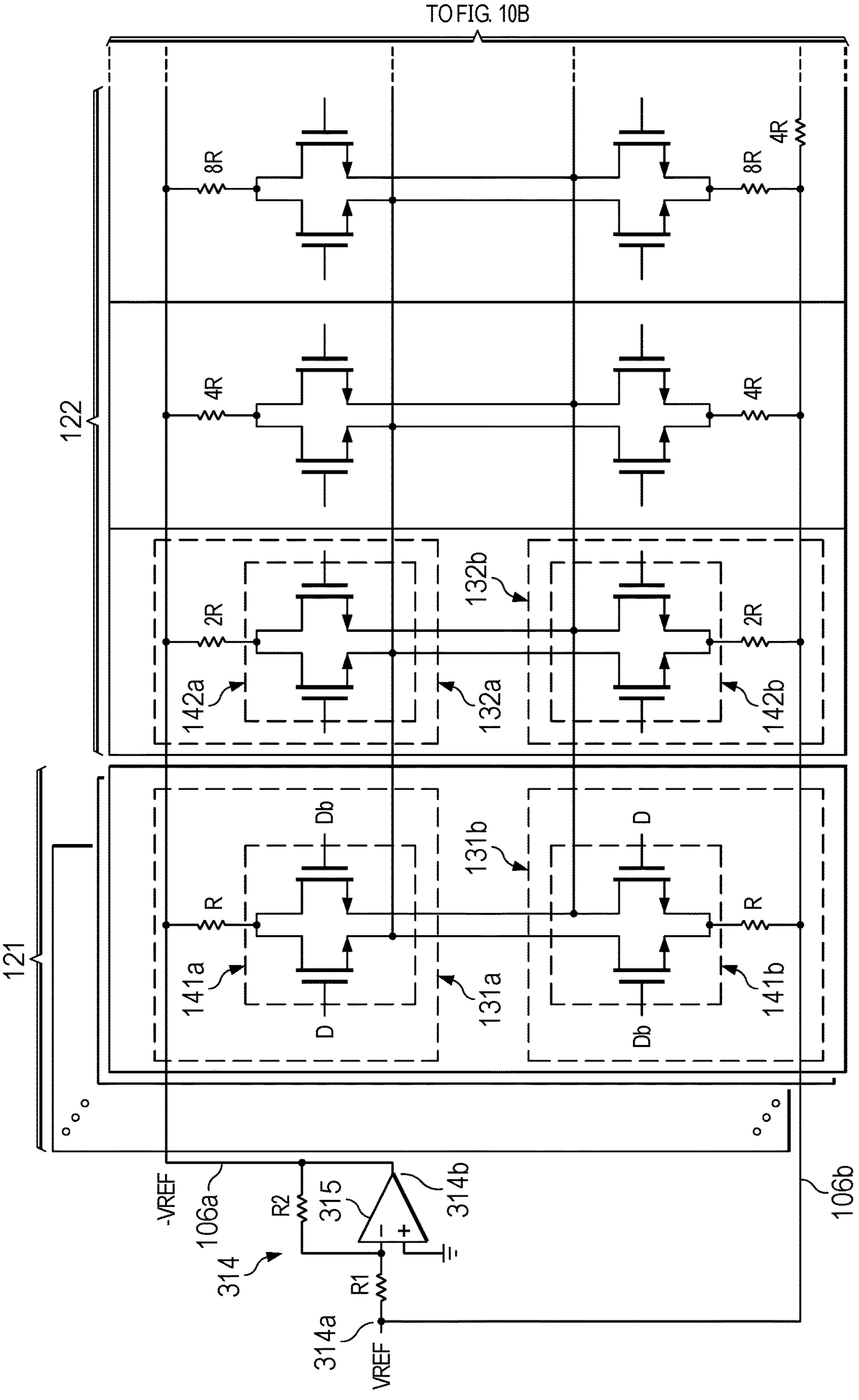
FIGS. 10A and 10B (collectively, FIG. 10) have a schematic diagram of the MDAC of FIG. 6 and includes a second digitally-controlled impedance circuit, in an example.
Figure 10B:
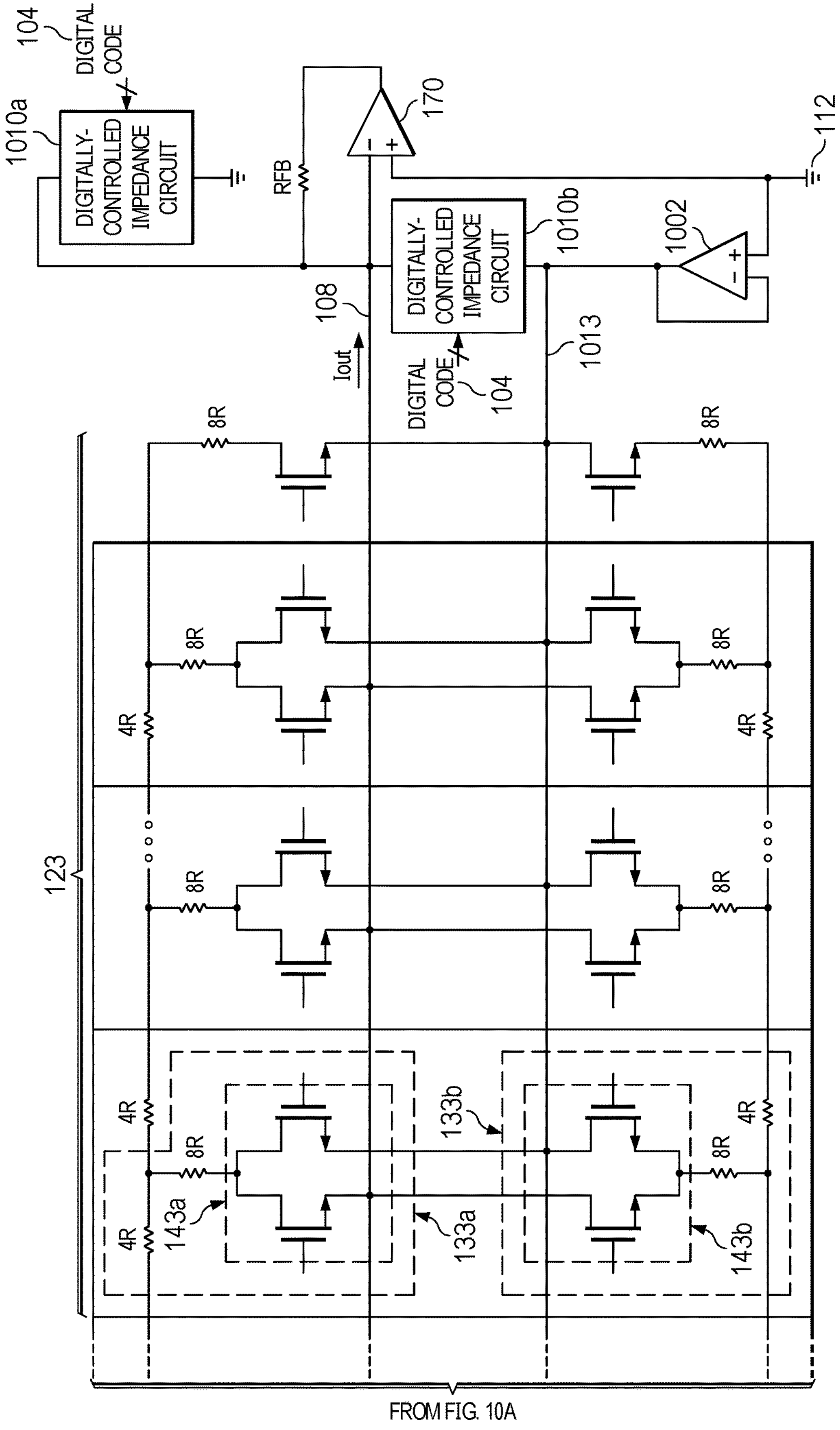

FIG. 10 is a schematic diagram of an MDAC 305 as in FIG. 6 which includes digitally-controlled impedance circuits 1010*a* and 1010*b*. In some examples, both digitally-controlled impedance circuits 1010*a* and 1010*b* are implemented the same as for digitally-controlled impedance circuit 610. Digitally-controlled impedance circuit 1010*a* is coupled between output 108 and ground 112 and digitally-controlled impedance circuit 1010*b* is coupled between output 108 and terminal 1013 of the RDACs 110*a*, 110*b*. FIG. 10 also illustrates a ground buffer 1002 coupled between terminal 1013 and ground 112. Ground buffer 1002 provides a low impedance path for the current to/from the RDACs 110*a*, 110*b* to reduce non-linearity. Terminal 1013 is coupled directly to ground 112 in the examples of FIGS. 3, 5, 6, and 8, but in FIG. 10, terminal 1013 is coupled to the output of ground buffer 1002. The positive input of ground buffer 1002 is coupled to ground, and the negative input of ground buffer 1002 is coupled to the output of ground buffer 1002 and to terminal 1013. As mentioned above, a ground buffer may have a DC offset that contributes to the non-linearity of the MDAC.

In one example, the resistances implemented by digitally-controlled impedance circuit 1010*b* are chosen to equalize the transfer function from the DC offset voltage of ground buffer 1002 and the output current IOUT. The resistances implemented by digitally-controlled impedance circuit 1010*b* are chosen such that the parallel combination of the resistances of digitally-controlled impedance circuits 1010*a* and 1010*b* are the resistances that reduce the non-linearity of the digital code dependency of the R-2R slices 123, described above.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. An apparatus, comprising:

a first resistive digital-to-analog converter (RDAC) having a first reference voltage input and a first output, the first RDAC includes a first resistor segment coupled to the first reference voltage input, the first resistor segment including a first resistor and a first selection circuit, the first selection circuit having an input coupled to the first resistor and having a first selection circuit output coupled to the first output and a second selection circuit output coupled to a ground terminal; and a second RDAC having a second reference voltage input and a second output, the second output coupled to the first output, the second RDAC including a second resistor segment coupled to the second reference voltage input, the second resistor segment including a second resistor and a second selection circuit, the second selection circuit having an input coupled to the second resistor and having a third selection circuit output coupled to the first selection circuit output and a fourth selection circuit output coupled to the ground terminal, wherein:

based on a first logic state of a bit, the first selection circuit is configured to electrically couple the first resistor to the first output, and the second selection circuit is configured to electrically couple the second resistor to the ground terminal; and based on a second logic state of the bit, the first selection circuit is configured to electrically couple the first resistor to the ground terminal, and the second selection circuit is configured to electrically couple the second resistor to the first output.

2. The apparatus of claim 1, further comprising an inverting buffer having an input and output, the input of the inverting buffer coupled to the second reference voltage input and the output of the inverting buffer coupled to the first reference voltage input.

3. The apparatus of claim 1, wherein:

the first reference voltage input and the second voltage reference input are coupled by an inverting amplifier.

4. The apparatus of claim 1, wherein:

the first resistor segment is a first thermometric slice, and the first RDAC includes a first binary slice and a first resistor-two resistor (R-2R) slice; and the second resistor segment is a second thermometric slice, and the second RDAC includes a second binary slice and a second R-2R slice.

5. The apparatus of claim 1, wherein one of the first reference voltage input or the second reference voltage input is coupled to a ground terminal.

6. The apparatus of claim 1, further comprising a digitally-controlled impedance circuit having a control input, a first terminal coupled to the first output, and a second terminal coupled to the ground terminal, the digitally-controlled impedance circuit configured to couple a resistance between the first output and the ground terminal based on a digital code at the control input.

7. The apparatus of claim 1, further comprising a current-to-voltage converter having an input coupled to the first output.

8. An apparatus, comprising:

a resistive digital-to-analog converter (RDAC) having a reference voltage terminal, a digital input terminal, and an output; and a digitally-controlled impedance circuit having a control input and an output, the output of the digitally-controlled impedance circuit coupled to the output of the RDAC, wherein the digitally-controlled impedance circuit includes a resistor circuit and a look-up table (LUT), the LUT having an input coupled to the digital input of the RDAC and having an output coupled to the resistor circuit.

9. The apparatus of claim 8, wherein the digitally-controlled impedance circuit is configured to provide a resistance between the output of the RDAC and a ground terminal based on a digital code at the control input.

10. The apparatus of claim 8, wherein the LUT is configured to provide a control signal to the resistor circuit based on a digital code at the input of the LUT.

11. The apparatus of claim 8, wherein the RDAC is a first RDAC, the reference voltage terminal is a first reference voltage terminal, and the output of the RDAC is a first output, and the apparatus further comprises a second RDAC having a second reference voltage terminal, and a second output coupled to the first output.

12. The apparatus of claim 11, wherein one of the first reference voltage terminal or the second reference voltage terminal is coupled to a ground terminal.

13. The apparatus of claim 11, wherein:

the first RDAC includes a first resistor segment coupled to the first reference voltage terminal, the first resistor segment including a first resistor and a first selection circuit, the first selection circuit having an input coupled to the first resistor and having a first selection circuit output coupled to the first output and a second selection circuit output coupled to a ground terminal; and the second RDAC including a second resistor segment coupled to the second reference voltage terminal, the second resistor segment including a second resistor and a second selection circuit, the second selection circuit having an input coupled to the second resistor and having a third selection circuit output coupled to the first selection circuit output and a fourth selection circuit output coupled to the ground terminal.

14. The apparatus of claim 13, further comprising an inverting buffer having an input and output, the input of the inverting buffer coupled to the second reference voltage terminal and the output of the inverting buffer coupled to the first reference voltage terminal, and based on a first logic state of a bit, the first selection circuit is configured to electrically couple the first resistor to the first output and the second selection circuit is configured to electrically couple the second resistor to the ground terminal; and based on a second logic state of the bit, the first selection circuit is configured to electrically couple the first resistor to the ground terminal and the second selection circuit is configured to electrically couple the second resistor to the first output.

15. An apparatus, comprising:

a first resistive digital-to-analog converter (RDAC) having a ground terminal and a first output, the first RDAC includes a first resistor segment coupled to the ground terminal, the first resistor segment including a first resistor and a first selection circuit, the first selection circuit having an input coupled to the first resistor and having a first selection circuit output coupled to the first output and a second selection circuit output coupled to the ground terminal; and a second RDAC having a first reference voltage terminal and a second output, the second output coupled to the first output, the second RDAC including a second resistor segment coupled to the first reference voltage terminal, the second resistor segment including a second resistor and a second selection circuit, the second selection circuit having an input coupled to the second resistor and having a third selection circuit output coupled to the first selection circuit output and a fourth selection circuit output coupled to the ground terminal, wherein:

based on a first logic state of a bit, the first selection circuit is configured to electrically couple the first resistor to the first output, and the second selection circuit is configured to electrically couple the second resistor to the ground terminal; and based on a second logic state of the bit, the first selection circuit is configured to electrically couple the first resistor to the ground terminal, and the second selection circuit is configured to electrically couple the second resistor to the first output.

16. The apparatus of claim 15, further comprising a current-to-voltage converter having an input coupled to the first output.

17. The apparatus of claim 16, further comprising a resistor circuit having a control input and an output, the output of the resistor circuit coupled to the first output.

18. The apparatus of claim 17, wherein the resistor circuit is configured to provide a resistance between the first output and the ground terminal based on a digital code at the control input.

19. The apparatus of claim 18, wherein the first RDAC has a digital input, and the apparatus further includes a look-up table (LUT) having an input coupled to the digital input of the first RDAC and having an output coupled to the input of the resistor circuit.

* * * * *